(12) United States Patent
Fujimura et al.

(10) Patent No.: US 9,057,956 B2
(45) Date of Patent: Jun. 16, 2015

(54) METHOD AND SYSTEM FOR DESIGN OF ENHANCED EDGE SLOPE PATTERNS FOR CHARGED PARTICLE BEAM LITHOGRAPHY

(75) Inventors: Akira Fujimura, Saratoga, CA (US); Kazuyuki Hagiwara, Tokyo (JP); Stephen F. Meier, Sunnyvale, CA (US); Ingo Bork, Mountain View, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 13/037,270

(22) Filed: Feb. 28, 2011

(65) Prior Publication Data

US 2012/0221981 A1 Aug. 30, 2012

(51) Int. Cl.
*G06F 17/50* (2006.01)
*G03F 7/20* (2006.01)

(52) U.S. Cl.
CPC ............ *G03F 7/2061* (2013.01); *G03F 7/2063* (2013.01)

(58) Field of Classification Search
USPC ............................... 716/50, 51, 52, 53, 54, 55
See application file for complete search history.

(56) References Cited

U.S. PATENT DOCUMENTS

| | | | |
|---|---|---|---|
| 4,264,711 A | 4/1981 | Greeneich | |
| 4,634,871 A | 1/1987 | Knauer | |
| 4,698,509 A | 10/1987 | Wells et al. | |
| 4,818,885 A | 4/1989 | Davis et al. | |
| 5,051,598 A | 9/1991 | Ashton et al. | |
| 5,082,762 A | 1/1992 | Takahashi | |
| 5,103,101 A | 4/1992 | Berglund et al. | |
| 5,173,582 A | 12/1992 | Sakamoto et al. | |
| 5,334,282 A | 8/1994 | Nakayama et al. | |
| 5,723,237 A | 3/1998 | Kobayashi et al. | |
| 5,804,339 A | 9/1998 | Kim | |
| 5,825,039 A | 10/1998 | Hartley | |
| 5,856,677 A | 1/1999 | Okino | |
| 5,885,748 A * | 3/1999 | Ohnuma | 430/296 |
| 6,001,513 A | 12/1999 | Hector | |
| 6,087,046 A | 7/2000 | Nakasuji | |
| 6,218,671 B1 | 4/2001 | Gordon et al. | |
| 6,262,427 B1 | 7/2001 | Gordon | |
| 6,291,119 B2 * | 9/2001 | Choi et al. | 430/30 |
| 6,298,473 B1 | 10/2001 | Ono et al. | |

(Continued)

FOREIGN PATENT DOCUMENTS

| | | |
|---|---|---|
| CN | 1193810 A | 9/1998 |
| EP | 1429368 A2 | 6/2004 |

(Continued)

OTHER PUBLICATIONS

Christophe Pierrat, Ingo Bork ("Impact of Model-Based Fracturing on E-beam Proximity Effect Correction Methodology", Proc. of SPIE vol. 7823, 782313, 2010 SPIE.*

(Continued)

*Primary Examiner* — Brian Ngo
(74) *Attorney, Agent, or Firm* — The Mueller Law Office, P.C.

(57) ABSTRACT

A method and system for fracturing or mask data preparation are presented in which overlapping shots are generated to increase dosage in selected portions of a pattern, thus improving the fidelity and/or the critical dimension variation of the transferred pattern. In various embodiments, the improvements may affect the ends of paths or lines, or square or nearly-square patterns. Simulation is used to determine the pattern that will be produced on the surface.

24 Claims, 9 Drawing Sheets

(56) References Cited

U.S. PATENT DOCUMENTS

| | | | |
|---|---|---|---|
| 6,372,391 B1 | 4/2002 | Wolfe et al. | |
| 6,433,348 B1* | 8/2002 | Abboud et al. | 250/492.22 |
| 6,557,162 B1 | 4/2003 | Pierrat | |
| 6,610,989 B1* | 8/2003 | Takahashi | 250/492.3 |
| 6,627,366 B2* | 9/2003 | Yang | 430/30 |
| 6,803,589 B2 | 10/2004 | Nakasugi | |
| 6,891,175 B2 | 5/2005 | Hiura | |
| 7,150,949 B2 | 12/2006 | Askebjer et al. | |
| 7,269,819 B2 | 9/2007 | Hoshino | |
| 7,449,700 B2 | 11/2008 | Inanami | |
| 7,498,591 B2 | 3/2009 | Lozes et al. | |
| 7,504,645 B2 | 3/2009 | Anpo et al. | |
| 7,536,664 B2* | 5/2009 | Cohn et al. | 716/119 |
| 7,592,611 B2 | 9/2009 | Kasahara et al. | |
| 7,759,027 B2 | 7/2010 | Fujimura et al. | |
| 7,824,828 B2 | 11/2010 | Fujimura et al. | |
| 7,901,850 B2 | 3/2011 | Fujimura et al. | |
| 7,902,528 B2 | 3/2011 | Hara et al. | |
| 8,057,970 B2 | 11/2011 | Fujimura et al. | |
| 8,137,871 B2* | 3/2012 | Zable et al. | 430/5 |
| 8,473,875 B2 | 6/2013 | Fujimura et al. | |
| 8,501,374 B2 | 8/2013 | Fujimura et al. | |
| 2001/0028981 A1 | 10/2001 | Okada et al. | |
| 2002/0005494 A1* | 1/2002 | Kamijo et al. | 250/491.1 |
| 2002/0020824 A1 | 2/2002 | Itoh | |
| 2002/0125444 A1 | 9/2002 | Kojima | |
| 2002/0129328 A1 | 9/2002 | Komatsuda | |
| 2003/0043358 A1 | 3/2003 | Suganuma et al. | |
| 2003/0082461 A1 | 5/2003 | Carpi | |
| 2003/0087191 A1 | 5/2003 | Lavallee et al. | |
| 2003/0159125 A1 | 8/2003 | Wang et al. | |
| 2003/0203287 A1 | 10/2003 | Miyagawa | |
| 2004/0011966 A1 | 1/2004 | Sasaki et al. | |
| 2004/0099636 A1 | 5/2004 | Scipioni | |
| 2004/0131977 A1 | 7/2004 | Martyniuk et al. | |
| 2005/0053850 A1 | 3/2005 | Askebjer et al. | |
| 2005/0211921 A1 | 9/2005 | Wieland et al. | |
| 2005/0221204 A1 | 10/2005 | Kimura | |
| 2006/0073686 A1 | 4/2006 | Zach et al. | |
| 2006/0085773 A1* | 4/2006 | Zhang | 716/4 |
| 2006/0218520 A1* | 9/2006 | Pierrat et al. | 716/19 |
| 2007/0114463 A1* | 5/2007 | Nakasugi et al. | 250/492.23 |
| 2007/0196768 A1* | 8/2007 | Ogino | 430/296 |
| 2007/0280526 A1 | 12/2007 | Malik et al. | |
| 2008/0054196 A1 | 3/2008 | Hiroshima | |
| 2008/0116398 A1 | 5/2008 | Hara et al. | |
| 2009/0200495 A1 | 8/2009 | Platzgummer | |
| 2009/0297958 A1 | 12/2009 | Lee et al. | |
| 2009/0306805 A1 | 12/2009 | Kyoh | |
| 2009/0325085 A1* | 12/2009 | Yoshida et al. | 430/5 |
| 2010/0055581 A1 | 3/2010 | Fujimura et al. | |
| 2010/0055585 A1 | 3/2010 | Fujimura et al. | |
| 2010/0055586 A1 | 3/2010 | Fujimura et al. | |
| 2010/0058279 A1 | 3/2010 | Fujimura et al. | |
| 2010/0058281 A1 | 3/2010 | Fujimura et al. | |
| 2010/0058282 A1 | 3/2010 | Fujimura et al. | |
| 2010/0148087 A1* | 6/2010 | Doering et al. | 250/396 R |
| 2010/0183963 A1* | 7/2010 | Zable et al. | 430/30 |
| 2010/0264335 A1 | 10/2010 | Hoyle et al. | |
| 2010/0315611 A1* | 12/2010 | Kato | 355/55 |
| 2010/0325595 A1 | 12/2010 | Song et al. | |
| 2011/0033788 A1 | 2/2011 | Kato | |
| 2011/0053056 A1 | 3/2011 | Fujimura et al. | |
| 2011/0116067 A1 | 5/2011 | Ye et al. | |
| 2011/0145769 A1 | 6/2011 | Wei | |
| 2011/0159435 A1 | 6/2011 | Zable et al. | |
| 2011/0177458 A1 | 7/2011 | Kotani et al. | |
| 2012/0047474 A1 | 2/2012 | Choi et al. | |
| 2012/0149133 A1 | 6/2012 | Parrish et al. | |
| 2012/0151428 A1 | 6/2012 | Tanaka et al. | |
| 2012/0217421 A1 | 8/2012 | Fujimura et al. | |
| 2013/0070222 A1 | 3/2013 | Fujimura | |
| 2013/0283218 A1 | 10/2013 | Fujimura et al. | |

FOREIGN PATENT DOCUMENTS

| | | |
|---|---|---|
| GB | 2367908 | 4/2002 |
| JP | S5425675 A | 2/1979 |
| JP | S54025675 | 2/1979 |
| JP | S608844 A | 1/1985 |
| JP | 61105839 | 5/1986 |
| JP | 63007631 | 1/1988 |
| JP | H02280315 A | 11/1990 |
| JP | 03205815 | 9/1991 |
| JP | H03205815 A | 9/1991 |
| JP | 04058518 | 2/1992 |
| JP | 04096065 | 3/1992 |
| JP | 1992155337 | 5/1992 |
| JP | 04196516 | 7/1992 |
| JP | H04196516 A | 7/1992 |
| JP | 05036595 | 2/1993 |
| JP | H0536595 A | 2/1993 |
| JP | H05036595 | 2/1993 |
| JP | 05114549 | 5/1993 |
| JP | 05198483 | 8/1993 |
| JP | 05267132 | 10/1993 |
| JP | 05267133 | 10/1993 |
| JP | H05267133 A | 10/1993 |
| JP | H05335221 A | 12/1993 |
| JP | H0620931 A | 1/1994 |
| JP | H06020931 | 1/1994 |
| JP | 06124883 | 5/1994 |
| JP | 06252036 | 9/1994 |
| JP | 08055771 | 2/1996 |
| JP | H0855771 A | 2/1996 |
| JP | 08064522 | 3/1996 |
| JP | H08195339 A | 7/1996 |
| JP | 8222504 | 8/1996 |
| JP | H08222504 A | 8/1996 |
| JP | H09266153 A | 10/1997 |
| JP | 10294255 | 11/1998 |
| JP | H11111594 A | 4/1999 |
| JP | 11233401 | 8/1999 |
| JP | 2000066366 A | 3/2000 |
| JP | 2000091191 A | 3/2000 |
| JP | 2000123768 A | 4/2000 |
| JP | 2000138165 A | 5/2000 |
| JP | 2000269123 A | 9/2000 |
| JP | 2001013671 A | 1/2001 |
| JP | 2001093809 A | 4/2001 |
| JP | 2001203157 A | 7/2001 |
| JP | 2001230203 A | 8/2001 |
| JP | 2001305720 A | 11/2001 |
| JP | 2002075830 A | 3/2002 |
| JP | 2002110508 A | 4/2002 |
| JP | 2002202590 A | 7/2002 |
| JP | 2002217092 A | 8/2002 |
| JP | 2002351055 A | 12/2002 |
| JP | 2003195511 A | 7/2003 |
| JP | 2003315976 A | 11/2003 |
| JP | 2003338460 A | 11/2003 |
| JP | 2003347192 A | 12/2003 |
| JP | 2004088071 A | 3/2004 |
| JP | 2004134447 A | 4/2004 |
| JP | 2004134574 A | 4/2004 |
| JP | 2004170410 A | 6/2004 |
| JP | 2007041090 A | 6/2004 |
| JP | 2004273526 A | 9/2004 |
| JP | 2004304031 A | 10/2004 |
| JP | 2004356440 A | 12/2004 |
| JP | 2005079111 A | 3/2005 |
| JP | 2006032814 A | 2/2006 |
| JP | 2006059348 A | 3/2006 |
| JP | 2006100336 A | 4/2006 |
| JP | 2006100409 A | 4/2006 |
| JP | 2006108447 A | 4/2006 |
| JP | 2006222230 A | 8/2006 |
| JP | 2006294794 A | 10/2006 |
| JP | 2007103923 A | 4/2007 |
| JP | 2007242710 A | 9/2007 |
| JP | 2007305880 A | 11/2007 |
| JP | 2008053565 A | 3/2008 |
| JP | 2008066441 A | 3/2008 |

(56) References Cited

FOREIGN PATENT DOCUMENTS

| | | | |
|---|---|---|---|
| JP | 2008096486 A | 4/2008 |
| JP | 2009147254 A | 7/2009 |
| JP | 2011040716 A | 2/2011 |
| JP | 2001313253 A | 11/2011 |
| TW | 495834 B | 7/2002 |
| TW | I222100 B | 10/2004 |
| TW | I233149 B | 5/2005 |
| TW | 200604763 A | 2/2006 |
| TW | 200700932 | 1/2007 |
| WO | 03036386 A | 5/2003 |
| WO | 2004077156 A | 9/2004 |
| WO | 2008064155 A | 5/2008 |

OTHER PUBLICATIONS

Martin, L. et al., "New Writing Strategy in Electron Beam Direct Write Lithography to Improve Critical Dense Lines Patterning for Sub-45nm Nodes", Proceedings of SPIE, vol. 7470 (2009), pp. 74700R-1-74700R-12, SPIE, P.O. Box 10, Bellingham, WA. 98227, U.S.A.
Martin, L. et al., "Development of Multiple Pass Exposure in Electron Beam Direct Write Lithography for Sub-32nm Nodes", Proceedings of SPIE, vol. 7488 (2009), pp. 74881C-1-74881C-12, SPIE, P.O. Box 10, Bellingham, WA. 98227, U.S.A.
Office Action dated Mar. 31, 2011 for U.S. Appl. No. 12/750,709.
Office Action dated Jun. 22, 2012 for U.S. Appl. No. 13/037,268.
Office Action Dated Jan. 16, 2013 for U.S. Appl. No. 13/037,268.
Office Action dated Jan. 25, 2013 for U.S. Appl. No. 13/329,314.
Pierrat and Bork, "Impact of Model-Based Fracturing on E-beam Proximity Effect Correction Methodolgy", Proc, of SPIE. vol. 7823, Photomask Technology 2010, 782313, Sep. 29, 2010.
Notice of Allowance and Fees dated Aug. 2, 2013 for U.S. Appl. No. 13/710,426.
Office Action dated Jul. 23, 2013 for Japanese Patent Application No. 2009-200191.
Office Action dated Jul. 23, 2013 for Japanese Patent Application No. 2011-525072.
Office Action dated May 24, 2013 for U.S. Appl. No. 13/329,315.
International Search Report and Written Opinion dated Sep. 17, 2012 for PCT Application No. PCT/US2012/025328.
Office Action dated Aug. 16, 2012 for U.S. Appl. No. 13/329,315.
International Search Report and Written Opinion dated Oct. 18, 2012 for PCT Application No. PCT/US2012/025149.
International Search Report and Written Opinion dated Oct. 23, 2012 for PCT Application No. PCT/US2012/025148.
Chinese Office Action dated Sep. 11, 2013 for Chinese Application No. 200980134188.6.
Japanese Office Action dated Aug. 20, 2013 for Japanese Patent Application No. 2011-525073.
Japanese Office Action dated Oct. 1, 2013 for Japanese Patent Application No. 2011-525090.
Japanese Office Action dated Oct. 8, 2013 for Japanese Patent Application No. 2011-525091.
Notice of Allowance and Fee(s) dated Oct. 11, 2013 for U.S. Appl. No. 13/923,368.
Notice of Allowance and Fees dated Aug. 23, 2013 for U.S. Appl. No. 13/723,181.
Office Action dated Oct. 25, 2013 for U.S. Appl. No. 13/037,263.
Office Action dated Sep. 10, 2013 for U.S. Appl. No. 13/329,314.
Office Action dated Sep. 24, 2013 for U.S. Appl. No. 13/329,315.
Notice of Allowance and Fees dated Dec. 26, 2013 for U.S. Appl. No. 13/862,472.
Office Action dated Feb. 14, 2014 for U.S. Appl. No. 13/631,941.
Office Action dated Feb. 27, 2014 for U.S. Appl. No. 13/236,610.
Office Action dated Mar. 11, 2014 for U.S. Appl. No. 13/959,530.
Office Action dated Mar. 13, 2014 for U.S. Appl. No. 13/862,476.
Notice of Allowance and Fees dated Mar. 20, 2014 for U.S. Appl. No. 13/970,465.
Office Action dated Apr. 3, 2014 for Chinese patent application No. 200980134188.6.
Office Action dated May 9, 2014 for U.S. Appl. No. 14/106,584.
Office Action dated May 1, 2014 for U.S. Appl. No. 13/862,471.
Office Action dated May 5, 2014 for U.S. Appl. No. 13/862,475.
Search Report dated Apr. 9, 2014 for Taiwanese Application No. 98128358.
Office Action dated Apr. 15, 2014 for Japanese Patent Application No. 2011-525072.
Office Action dated Jun. 3, 2014 for Japanese Patent Application No. 2012-526931.
Office Action dated Jun. 10, 2014 for Japanese Patent Application No. 2011-525090.
Office Action dated Jun. 10, 2014 for JP Patent Application No. 2011-525073.
Office Action dated Jun. 3, 2014 for Japanese Patent Application No. 2012-535220.
Office Action dated Jun. 6, 2014 for U.S. Appl. No. 13/329,315.
Office Action dated May 13, 2014 for Japanese Patent Application No. 2010-183857.
Office Action dated May 16, 2014 for U.S. Appl. No. 13/948,725.
Office Action dated May 27, 2014 for Japanese Patent Application No. 2012-535223.
Notice of Allowance and Fees dated Aug. 1, 2014 for U.S. Appl. No. 14/108,135.
Notice of Allowance and Fees dated Aug. 15, 2014 for U.S. Appl. No. 13/959,530.
Notice of Allowance and Fees dated Jul. 23, 2014 for U.S. Appl. No. 13/970,465.
Office Action dated Aug. 5, 2014 for Japanese Patent Application No. 2012-525091.
Office Action dated Jul. 8, 2014 for Japanese Patent Application No. 2009-200191.
Office Action dated Oct. 6, 2014 for U.S. Appl. No. 14/331,008.
Official Letter and Search Report dated Aug. 21, 2014 for Taiwanese Patent Application No. 098128359.
Official letter and search report dated Aug. 6, 2014 for Taiwanese Patent Application No. 099127553.
Notice of Allowance and Fees dated Oct. 10, 2014 for U.S. Appl. No. 13/801,554.
Office Action dated Dec. 16, 2014 for U.S. Appl. No. 13/948,725.
Office Action dated Nov. 11, 2014 for Japanese Patent Application No. 2012-526931.
Office Action dated Oct. 15, 2014 for U.S. Appl. No. 13/862,476.
Office Action dated Oct. 20, 2014 for U.S. Appl. No. 13/862,471.
Office Action dated Oct. 24, 2014 for U.S. Appl. No. 14/106,584.
Official Letter and Search Report dated Oct. 24, 2014 for Taiwanese Patent Application No. 099134187.
Official Letter and Search Report dated Sep. 25, 2014 for Taiwanese Patent Application No. 099134186.
Official Letter and Search Report dated Sep. 25, 2014 for Taiwanese Patent Application No. 98128360.
Notice of Allowance and Fees dated Mar. 27, 2015 for U.S. Appl. No. 13/948,725.
Office Action dated Mar. 27, 2015 for U.S. Appl. No. 14/454,140.

* cited by examiner

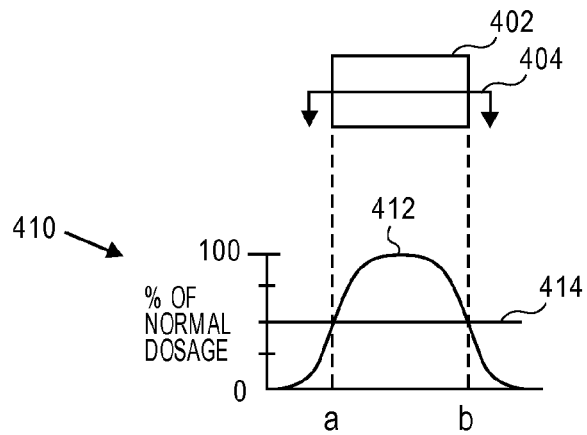
FIG. 4A
FIG. 4B
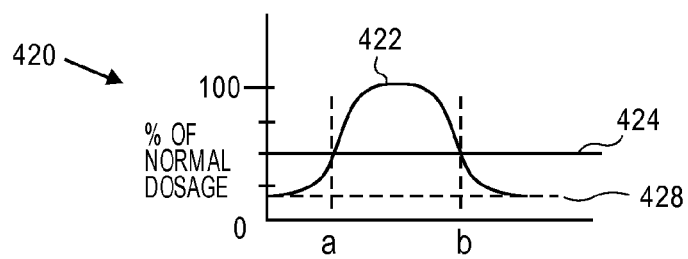
FIG. 4C
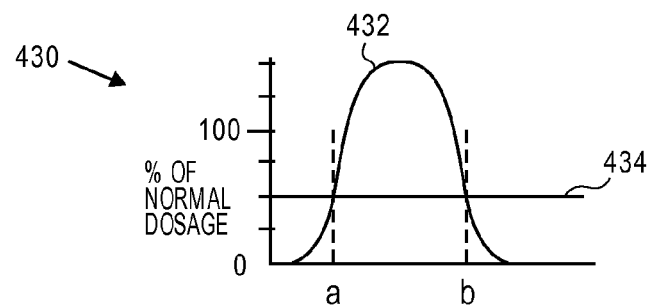
FIG. 4D
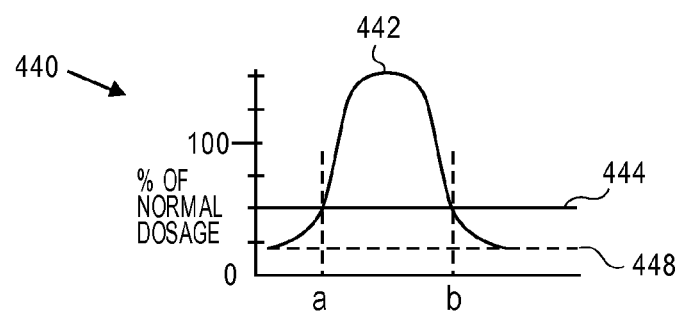
FIG. 4E
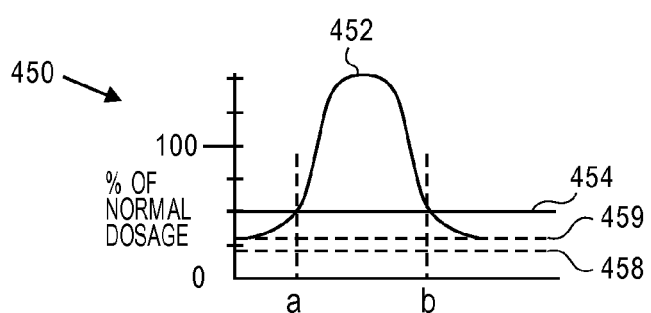
FIG. 4F

US 9,057,956 B2

METHOD AND SYSTEM FOR DESIGN OF ENHANCED EDGE SLOPE PATTERNS FOR CHARGED PARTICLE BEAM LITHOGRAPHY

RELATED APPLICATIONS

This application: 1) is related to U.S. patent application Ser. No. 13/037,263 filed Feb. 28, 2011 entitled "Method and System For Design Of A Surface To Be Manufactured Using Charged Particle Beam Lithography"; and 2) is related to U.S. patent application Ser. No. 13/037,268 filed Feb. 28, 2011 entitled "Method and System For Design Of Enhanced Accuracy Patterns For Charged Particle Beam Lithography"; both of which are hereby incorporated by reference for all purposes.

BACKGROUND OF THE DISCLOSURE

The present disclosure is related to lithography, and more particularly to the design and manufacture of a surface which may be a reticle, a wafer, or any other surface, using charged particle beam lithography.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays or even other reticles. Conventional optical lithography typically uses radiation of 193 nm wavelength or longer. Extreme ultraviolet (EUV) or X-ray lithography are also considered types of optical lithography, but use wavelengths much shorter than the 193 nm of conventional optical lithography. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, or magnetic recording heads.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Also, some patterns of a given layer may be written using optical lithography, and other patterns written using maskless direct write. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms, or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection.

As indicated, in optical lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on a corner of a pattern to sharpen the corner in the final transferred image. It is often the case that the precision demanded of the surface manufacturing process for SRAFs are less than those for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the main features on the mask.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are conventionally designed to avoid overlap wherever possible, so as to greatly simplify calculation of how the resist on the reticle will register the pattern. Similarly, the set of shots is designed so as to completely cover the pattern area that is to be formed on the reticle.

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process.

In EUV lithography, OPC features are generally not required. Therefore, the complexity of the pattern to be manufactured on the reticle is less than with conventional 193 nm wavelength optical lithography, and shot count reduction is correspondingly less important. In EUV, however, mask accuracy requirements are very high because the patterns on the mask, which are typically 4× the size of the patterns on the wafer, are sufficiently small that they are challenging to form precisely using charged particle beam technology such as E-beam.

There are numerous undesirable short-range and long-range effects associated with charged particle beam exposure. These effects can cause dimensional inaccuracies in the pattern transferred to a surface such as a reticle. These effects can also increase the dimensional changes that normal process variations cause in the transferred pattern. It would be desirable both to increase the accuracy of the transferred pattern, and also to reduce the dimensional changes associated with process variations.

SUMMARY OF THE DISCLOSURE

A method and system for fracturing or mask data preparation are presented in which overlapping shots are generated to increase dosage in selected portions of a pattern, thus improving the fidelity and/or the critical dimension variation of the transferred pattern. In various embodiments, the improvements may affect the ends of paths or lines, or square or nearly-square patterns. The shots may be varied in their amount of overlap, shot size, and dosage with respect to the dosage of another overlapping shot. Simulation is used to determine the pattern that will be produced on the surface. A method for manufacturing a surface is also disclosed.

BRIEF DESCRIPTION OF THE DRAWINGS

FIG. 4A illustrates an example of a shot outline from a rectangular shot;

FIG. 4B illustrates an example of a longitudinal dosage curve for the shot of FIG. 4A using a normal shot dosage;

FIG. 4C illustrates an example of a longitudinal dosage curve similar to FIG. 4B, with long-range effects included;

FIG. 4D illustrates an example of a longitudinal dosage curve for the shot of FIG. 4A using a higher than normal shot dosage;

FIG. 4E illustrates an example of a longitudinal dosage curve similar to FIG. 4D, with long-range effects included;

FIG. 4F illustrates an example of a longitudinal dosage curve similar to FIG. 4E, but with a higher background dosage level;

DETAILED DESCRIPTION OF THE EMBODIMENTS

The present disclosure describes a method for fracturing patterns into shots for a charged particle beam writer, where overlapping shots are generated to improve the accuracy and/or the edge slope of the pattern written to a surface. The use of overlapping shots in this application typically increases shot count and exposure time.

Figure 1:
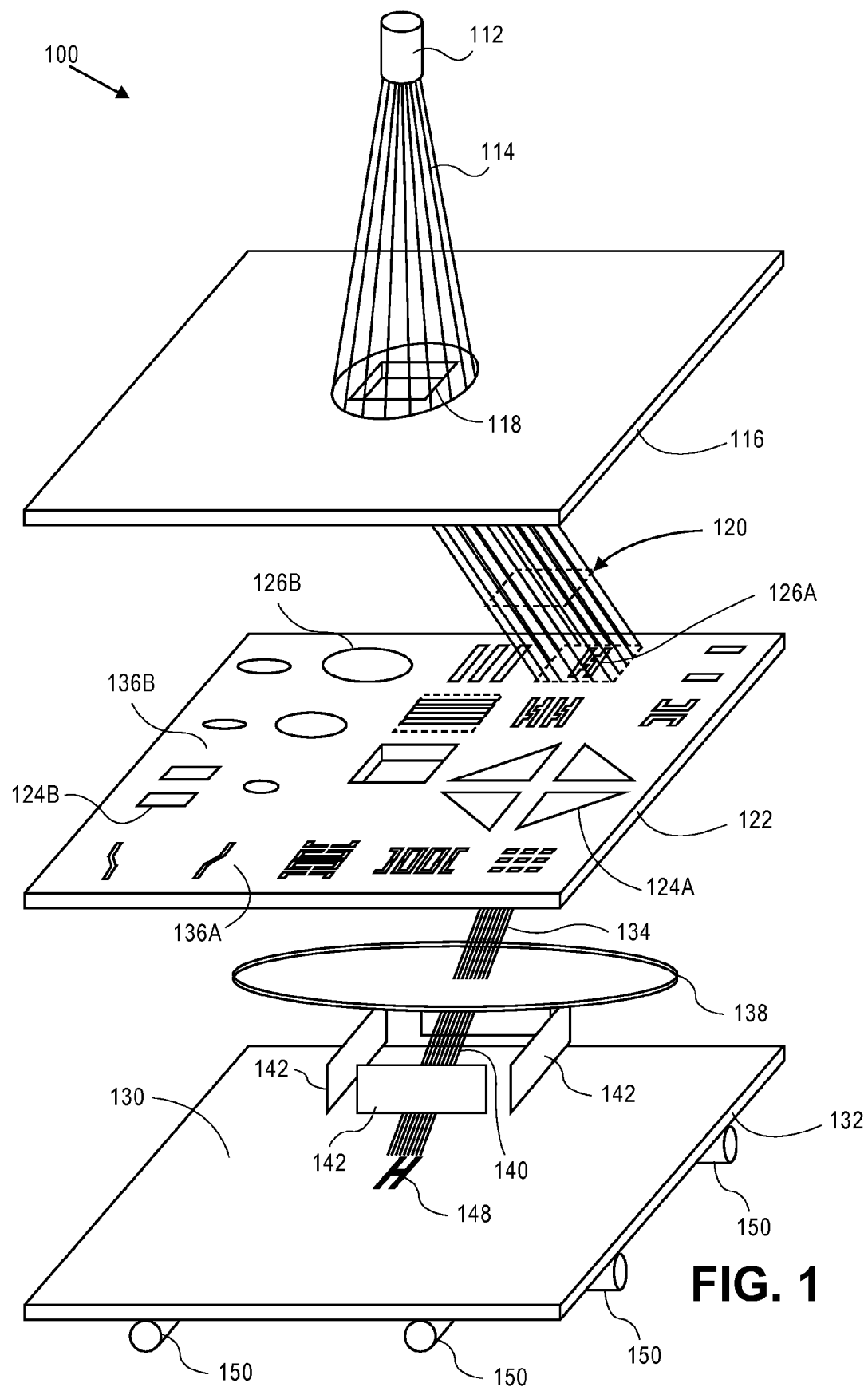
FIG. 1 illustrates an example of a character projection charged particle beam system.

Referring now to the drawings, wherein like numbers refer to like items, FIG. 1 illustrates an embodiment of a conventional lithography system 100, such as a charged particle beam writer system, in this case an electron beam writer system, that employs character projection to manufacture a surface 130. The electron beam writer system 100 has an electron beam source 112 that projects an electron beam 114 toward an aperture plate 116. The plate 116 has an aperture 118 formed therein which allows the electron beam 114 to pass. Once the electron beam 114 passes through the aperture 118 it is directed or deflected by a system of lenses (not shown) as electron beam 120 toward another rectangular aperture plate or stencil mask 122. The stencil 122 has formed therein a number of openings or apertures 124 that define various types of characters 126, which may be complex characters. Each character 126 formed in the stencil 122 may be used to form a pattern 148 on a surface 130 of a substrate 132, such as a silicon wafer, a reticle or other substrate. In partial exposure, partial projection, partial character projection, or variable character projection, electron beam 120 may be positioned so as to strike or illuminate only a portion of one of the characters 126, thereby forming a pattern 148 that is a subset of character 126. For each character 126 that is smaller than the size of the electron beam 120 defined by aperture 118, a blanking area 136, containing no aperture, is designed to be adjacent to the character 126, so as to prevent the electron beam 120 from illuminating an unwanted character on stencil 122. An electron beam 134 emerges from one of the characters 126 and passes through an electromagnetic or electrostatic reduction lens 138 which reduces the size of the pattern from the character 126. In commonly available charged particle beam writer systems, the reduction factor is between 10 and 60. The reduced electron beam 140 emerges from the reduction lens 138, and is directed by a series of deflectors 142 onto the surface 130 as the pattern 148, which is depicted as being in the shape of the letter "H" corresponding to character 126A. The pattern 148 is reduced in size compared to the character 126A because of the reduction lens 138. The pattern 148 is drawn by using one shot of the electron beam system 100. This reduces the overall writing time to complete the pattern 148 as compared to using a variable shape beam (VSB) projection system or method. Although one aperture 118 is shown being formed in the plate 116, it is possible that there may be more than one aperture in the plate 116. Although two plates 116 and 122 are shown in this example, there may be only one plate or more than two plates, each plate comprising one or more apertures.

In conventional charged particle beam writer systems the reduction lens 138 is calibrated to provide a fixed reduction factor. The reduction lens 138 and/or the deflectors 142 also focus the beam on the plane of the surface 130. The size of the surface 130 may be significantly larger than the maximum beam deflection capability of the deflection plates 142. Because of this, patterns are normally written on the surface in a series of stripes. Each stripe contains a plurality of sub-fields, where a sub-field is within the beam deflection capability of the deflection plates 142. The electron beam writer system 100 contains a positioning mechanism 150 to allow positioning the substrate 132 for each of the stripes and sub-fields. In one variation of the conventional charged particle beam writer system, the substrate 132 is held stationary while a sub-field is exposed, after which the positioning mechanism 150 moves the substrate 132 to the next sub-field position. In another variation of the conventional charged particle beam writer system, the substrate 132 moves continuously during the writing process. In this variation involving continuous movement, in addition to deflection plates 142, there may be another set of deflection plates (not shown) to move the beam at the same speed and direction as the substrate 132 is moved.

The minimum size pattern that can be projected with reasonable accuracy onto a surface 130 is limited by a variety of short-range physical effects associated with the electron beam writer system 100 and with the surface 130, which normally comprises a resist coating on the substrate 132. These effects include forward scattering, Coulomb effect, and resist diffusion. Beam blur is a term used to include all of these short-range effects. The most modern electron beam writer systems can achieve an effective beam blur in the range of 20 nm to 30 nm. Forward scattering may constitute one quarter to one half of the total beam blur. Modern electron beam writer systems contain numerous mechanisms to reduce each of the constituent pieces of beam blur to a minimum. Some electron beam writer systems may allow the beam blur to be varied during the writing process, from the minimum value available on an electron beam writing system to one or more larger values.

The shot dosage of a charged particle beam writer such as an electron beam writer system is a function of the intensity of the beam source 112 and the exposure time for each shot. Typically the beam intensity remains fixed, and the exposure time is varied to obtain variable shot dosages. The exposure time may be varied to compensate for various long-range effects such as backscatter and fogging in a process called proximity effect correction (PEC). Electron beam writer systems usually allow setting an overall dosage, called a base dosage, that affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before proximity effect correction. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels. Some embodiments of the current invention are targeted for use with charged particle beam writing systems which either do not allow dosage assignment on a shot-by-shot basis, or which allow assignment of one of a relatively few dosage levels.

Figure 2A:
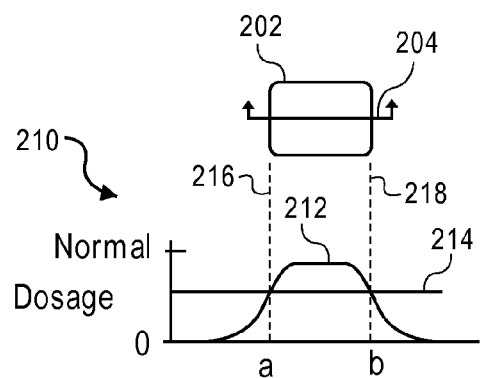
FIG. 2A illustrates an example of a single charged particle beam shot and a cross-sectional dosage graph of the shot.
Figure 2B:
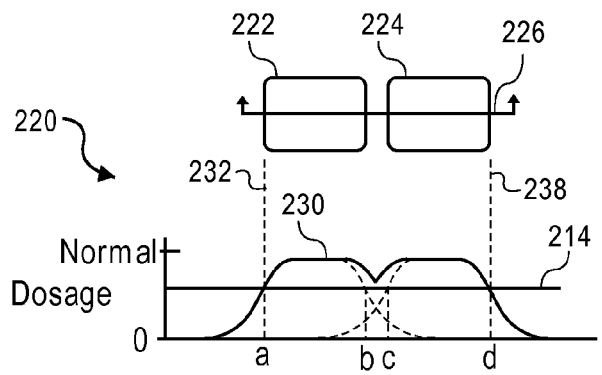
FIG. 2B illustrates an example of a pair of proximate shots and a cross-sectional dosage graph of the shot pair.

FIGS. 2A-B illustrate how energy is registered on a resist-coated surface from one or more charged particle beam shots. In FIG. 2A rectangular pattern 202 illustrates a shot outline, which is a pattern that will be produced on a resist-coated surface from a shot which is not proximate to other shots. The corners of pattern 202 are rounded due to beam blur. In dosage graph 210, dosage curve 212 illustrates the cross-sectional dosage along a line 204 through shot outline 202. Line 214 denotes the resist threshold, which is the dosage above which the resist will register a pattern. As can be seen from dosage graph 210, dosage curve 212 is above the resist threshold between the X-coordinates "a" and "b". Coordinate "a" corresponds to dashed line 216, which denotes the left-most extent of the shot outline 202. Similarly, coordinate "b" corresponds to dashed line 218, which denotes the right-most extent of the shot outline 202. The shot dosage for the shot in the example of FIG. 2A is a normal dosage, as marked on dosage graph 210. In conventional mask writing methodology, the normal dosage is set so that a relatively large rectangular shot will register a pattern of the desired size on the resist-coated surface, in the absence of long-range effects. The normal dosage therefore depends on the value of the resist threshold 214.

Figure 2C:
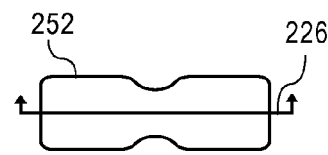
FIG. 2C illustrates an example of a pattern formed on a resist-coated surface from the pair of FIG. 2B shots.

FIG. 2B illustrates the shot outlines of two particle beam shots, and the corresponding dosage curve. Shot outline 222 and shot outline 224 result from two proximate particle beam shots. In dosage graph 220, dosage curve 230 illustrates the dosage along the line 226 through shot outlines 222 and 224. As shown in dosage curve 230, the dosage registered by the resist along line 226 is the combination, such as the sum, of the dosages from two particle beam shots, represented by shot outline 222 and shot outline 224. As can be seen, dosage curve 230 is above the threshold 214 from X-coordinate "a" to X-coordinate "d". This indicates that the resist will register the two shots as a single shape, extending from coordinate "a" to coordinate "d". FIG. 2C illustrates a pattern 252 that the two shots from the example of FIG. 2B may form. The variable width of pattern 252 is the result of the gap between shot outline 222 and shot outline 224, and illustrates that a gap between the shots 222 and 224 causes dosage to drop below threshold near the corners of the shot outlines closest to the gap.

When using conventional non-overlapping shots using a single exposure pass, conventionally all shots are assigned a normal dosage before PEC dosage adjustment. A charged particle beam writer which does not support shot-by-shot dosage assignment can therefore be used by setting the base dosage to a normal dosage. If multiple exposure passes are used with such a charged particle beam writer, the base dosage is conventionally set according to the following equation:

base dosage=normal dosage/# of exposure passes

Figure 3A:
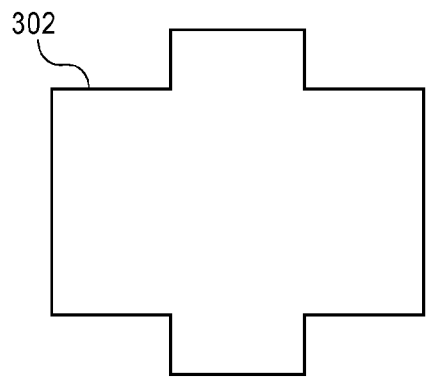
FIG. 3A illustrates an example of a polygonal pattern.
Figure 3B:
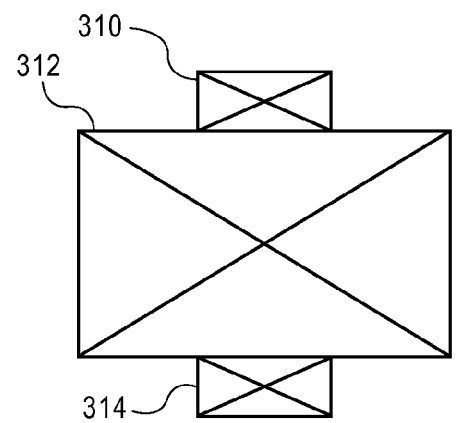
FIG. 3B illustrates an example of a conventional fracturing of the polygonal pattern of FIG. 3A.
Figure 3C:
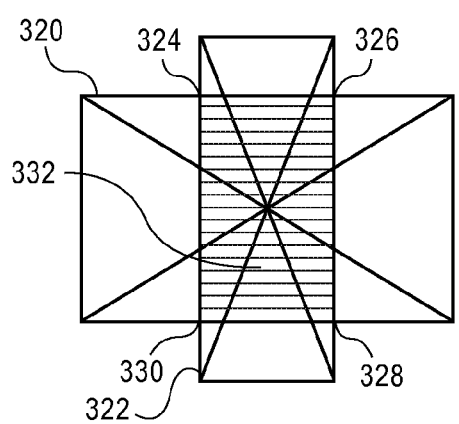
FIG. 3C illustrates an example of an alternate fracturing of the polygonal pattern of FIG. 3A.

FIGS. 3A-C illustrate two known methods of fracturing a polygonal pattern. FIG. 3A illustrates a polygonal pattern 302 that is desired to be formed on a surface. FIG. 3B illustrates a conventional method of forming this pattern using non-overlapping or disjoint shots. Shot outline 310, shot outline 312 and shot outline 314, which are marked with X's for clarity, are mutually disjoint. Additionally, the three shots associated with these shot outlines all use a desired normal dosage, before proximity effect correction. An advantage of using the conventional method as shown in FIG. 3B is that the response of the resist can be easily predicted. Also, the shots of FIG. 3B can be exposed using a charged particle beam system which does not allow dosage assignment on a shot-by-shot basis, by setting the base dosage of the charged particle beam writer to the normal dosage. FIG. 3C illustrates an alternate method of forming the pattern 302 on a resist-coated surface using overlapping shots, disclosed in U.S. patent application Ser. No. 12/473,265, filed May 27, 2009 and entitled "Method And System For Design Of A Reticle To Be Manufactured Using Variable Shaped Beam Lithography." In FIG. 3C the constraint that shot outlines cannot overlap has been eliminated, and shot 320 and shot 322 do overlap. In the example of FIG. 3C, allowing shot outlines to overlap enables forming the pattern 302 in only two shots, compared to the three shots of FIG. 3B. In FIG. 3C, however the response of the resist to the overlapping shots is not as easily predicted as in FIG. 3B. In particular, the interior corners 324, 326, 328 and 330 may register as excessively rounded because of the large dosage received by overlapping region 332, shown by horizontal line shading. Charged particle beam simulation may be used to determine the pattern registered by the resist. In one embodiment, charged particle beam simulation may be used to calculate the dosage for each grid location in a two-dimensional (X and Y) grid, creating a grid of calculated dosages called a dosage map. The results of charged particle beam simulation may indicate use of non-normal dosages for shot 320 and shot 322. Additionally, in FIG. 3C the overlapping of shots in area 332 increases the area dosage beyond what it would be without shot overlap. While the overlap of two individual shots will not increase the area dosage significantly, this technique will increase area dosages and total dosage if used throughout a design.

In exposing, for example, a repeated pattern on a surface using charged particle beam lithography, the size of each pattern instance, as measured on the final manufactured surface, will be slightly different, due to manufacturing variations. The amount of the size variation is an essential manufacturing optimization criterion. In mask masking today, a root mean square (RMS) variation of no more than 1 nm (1 sigma) may be desired. More size variation translates to more variation in circuit performance, leading to higher design margins being required, making it increasingly difficult to design faster, lower-power integrated circuits. This variation is referred to as critical dimension (CD) variation. A low CD variation is desirable, and indicates that manufacturing variations will produce relatively small size variations on the final manufactured surface. In the smaller scale, the effects of a high CD variation may be observed as line edge roughness (LER). LER is caused by each part of a line edge being slightly differently manufactured, leading to some waviness in a line that is intended to have a straight edge. CD variation is inversely related to the slope of the dosage curve at the resist threshold, which is called edge slope. Therefore, edge slope, or dose margin, is a critical optimization factor for particle beam writing of surfaces.

FIG. 4A illustrates an example of an outline of a rectangular shot 402. FIG. 4B illustrates an example of a dosage graph 410 illustrating the dosage along the line 404 through shot outline 402 with a normal shot dosage, with no backscatter, such as would occur if shot 402 was the only shot within the range of backscattering effect, which, as an example, may be 10 microns. Other long-range effects are also assumed to contribute nothing to the background exposure of FIG. 4B, leading to a zero background exposure level. The total dosage delivered to the resist is illustrated on the y-axis, and is 100% of a normal dosage. Because of the zero background exposure, the total dosage and the shot dosage are the same. Dosage graph 410 also illustrates the resist threshold 414. The CD variation of the shape represented by dosage graph 410 in the x-direction is inversely related to the slope of the dosage curve 412 at x-coordinates "a" and "b" where it intersects the resist threshold.

The FIG. 4B condition of zero background exposure is not reflective of actual designs. Actual designs will typically have many other shots within the backscattering distance of shot 402. FIG. 4C illustrates an example of a dosage graph 420 of a shot with a normal dosage with non-zero background exposure 428. In this example, a background exposure of 20% of a normal dosage is shown. In dosage graph 420, dosage curve 422 illustrates the cross-sectional dosage of a shot similar to shot 402. The CD variation of curve 422 is worse than the CD variation of curve 412, as indicated by the lower edge slope where curve 422 intersects resist threshold 424 at points "a" and "b", due to the background exposure caused by backscatter.

One method of increasing the slope of the dosage curve at the resist threshold is to increase the shot dosage. FIG. 4D illustrates an example of a dosage graph 430 with a dosage curve 432 which illustrates a total dosage of 150% of normal dosage, with no background exposure. With no background exposure, the shot dosage equals the total dosage. Threshold 434 in FIG. 4D is unchanged from threshold 414 in FIG. 4B. Increasing shot dosage increases the size of a pattern registered by the resist. Therefore, to maintain the size of the resist pattern, illustrated as the intersection points of dosage curve 432 with threshold 434, the shot size used for dosage graph 430 is somewhat smaller than shot 402. As can be seen, the slope of dosage curve 432 is higher where it intersects threshold 434 than is the slope of dosage curve 412 where it intersects threshold 414, indicating a lower, improved, CD variation for the higher-dosage shot of FIG. 4D than for the normal dosage shot of FIG. 4B.

Like dosage graph 410, however, the zero background exposure condition of dosage graph 430 is not reflective of actual designs. FIG. 4E illustrates an example of a dosage graph 440 with the shot dosage adjusted to achieve a total dosage on the resist of 150% of normal dosage with a 20% background exposure, such as would occur if the dosage of only one shot was increased to achieve total dosage of 150% of a normal dosage, and dosage of other shots remained at 100% of normal dosage. The threshold 444 is the same as in FIGS. 4B-4D. The background exposure is illustrated as line 448. As can be seen, the slopes of dosage curve 442 at x-coordinates "a" and "b" are less than the slopes of dosage curve 432 at x-coordinates "a" and "b" because of the presence of backscatter. Comparing graphs 420 and 440 for the effect of shot dosage, the slope of dosage curve 442 at x-coordinates "a" and "b" is higher than the slope of dosage curve 422 at the same x-coordinates, indicating that improved edge slope can be obtained for a single shot by increasing dosage, if dosages of other shots remain the same.

FIG. 4F illustrates an example of a dosage graph 450, illustrating the case where the dosages of all shots have been increased to 150% of normal dose. Two background dosage levels are shown on dosage graph 450: a 30% background dose 459, such as may be produced if all shots use 150% of normal dosage, and a 20% background dose 458 shown for comparison, since 20% is the background dosage in the dosage graph 440. Dosage curve 452 is based on the 30% background dose 459. As can be seen, the edge slope of dosage curve 452 at x-coordinates "a" and "b" is less than that of dosage curve 442 at the same points.

In summary, FIGS. 4A-F illustrate that higher-than-normal dosage can be used selectively to lower CD variation for isolated shapes. Increasing dosage has two undesirable effects, however. First, an increase in dose is achieved in modern charged particle beam writers by lengthening exposure time. Thus, an increase in dose increases the writing time, which increases cost. Second, as illustrated in FIGS. 4E-F, if many shots within the backscatter range of each other use an increased dosage, the increase in backscatter reduces the edge slope of all shots, thereby worsening CD variation for all shots of a certain assigned dosage. The only way for any given shot to avert this problem is to increase dosage and shoot a smaller size. However, doing this increases the backscatter even more. This cycle causes all shots to be at a higher dose, making write times even worse. Therefore, it is better to increase dose only for shots that define the edge.

Figure 5A:
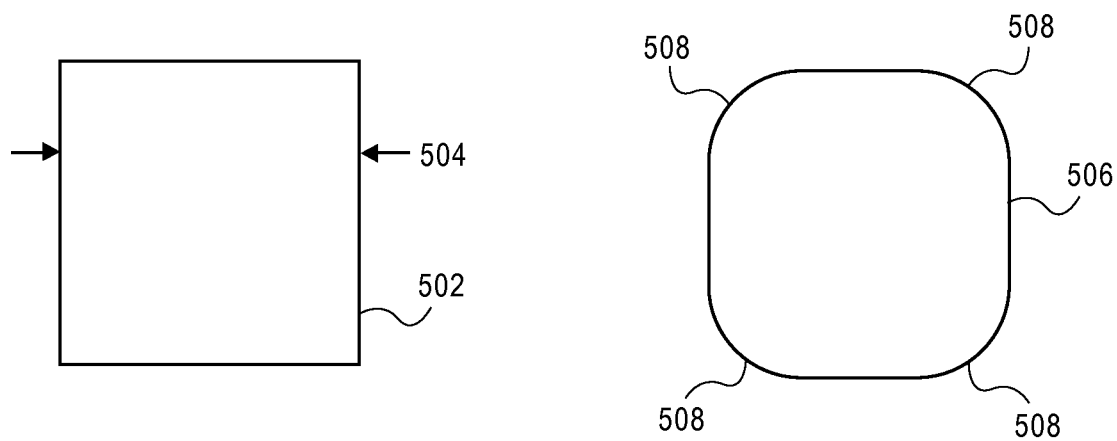
FIG. 5A illustrates an example of how a 100 nm square VSB shot may be registered on a reticle.
Figure 5B:
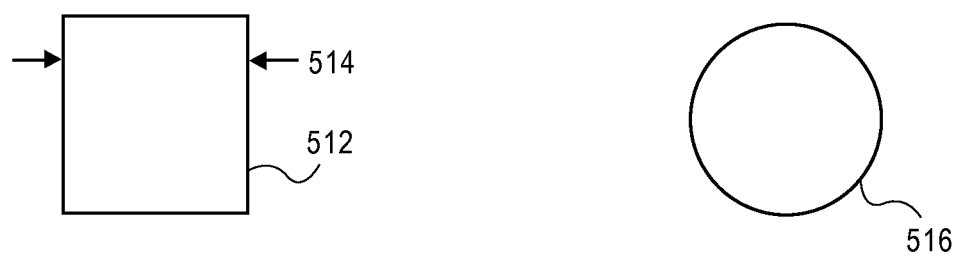
FIG. 5B illustrates an example of how a 60 nm square VSB shot may be registered on a reticle.

FIG. 5A illustrates an example of a square VSB shot 502. In this example square 502 has a dimension 504 of 100 nm. Pattern 506 is an example of how shot 502, with a normal dose, may register on a resist-coated surface. As can be seen, the corners 508 of pattern 506 are rounded, due to beam blur. If formed on a reticle to be used for EUV optical lithography using 4× reduction printing, pattern 506 could be used to form a pattern on a wafer having a size of approximately 25 nm. FIG. 5B illustrates an example of a smaller square VSB shot 512. In this example, the dimension 514 of shot 512 is 60 nm, suitable for manufacturing a 4× reticle for a pattern intended to be 15 nm on a wafer. Pattern 516 is an example of how shot 512 may register on a resist-coated surface. As can be seen, the corner rounding effects of beam blur have caused the registered pattern to be virtually circular. Additionally, though not illustrated, the edge slope of pattern 516 will be lower than that of pattern 506, and may be below a minimum pre-determined level to produce acceptable CD variation. FIGS. 5A&B illustrate how beam blur effects become more significant as pattern dimensions decrease.

As fabrication processes get smaller, short-range beam blur effects become a more significant issue for both direct-write and for reticle/mask fabrication. Small geometries can also have problems with edge slope due to long-range effects. Accurate fabrication of the ends of minimum-width lines—that is the lines having the minimum width permissible in a fabrication process—can become challenging using conventional techniques, as will be shown below. One type of pattern on which these problems may be exhibited is at a line end, which is the region near an end of a path, where the path may be of constant width, such as interconnect lines or where polysilicon crosses and extends beyond diffusion to form a MOS transistor.

Figure 6A:
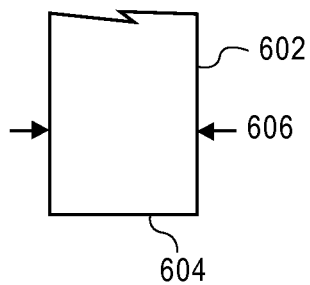
FIG. 6A illustrates an example of a pattern comprising the end portion of a line.
Figure 6B:
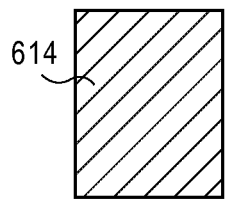
FIG. 6B illustrates an example of a conventional single-shot method of forming the pattern of FIG. 6A on a surface.
Figure 6C:
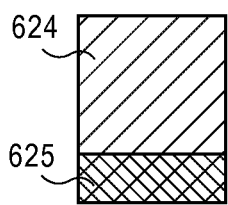
FIG. 6C illustrates an example of a method of forming the pattern of FIG. 6A on a surface by one embodiment of the current invention.

FIG. 6A illustrates an example of a portion 602 of a line that is desired to be formed on a reticle. The portion includes line end 604. In this example the designed width on the wafer is 20 nm. Using a 4× mask, the target width 606 on the reticle is therefore 80 nm. FIG. 6B illustrates an example of an outline of a single VSB shot 614 that may be used with normal dosage to conventionally form the pattern on a reticle. FIG. 6B also illustrates a pattern 618 formed on the reticle by the shot 614. As can be seen, the corners of line-end pattern 618 are significantly rounded. A portion 619 of the perimeter of pattern 618 is illustrated with a dashed line, indicating that this portion of the perimeter has an edge slope that is less than a pre-determined minimum. FIG. 6C illustrates an example of a method for forming the pattern 602 according to the current invention. In FIG. 6C, two shots are used to expose the line-end pattern 602: shot 624 and shot 625 which overlaps shot 624. Shot 624 uses higher-than-normal dosage. The additional shot 625 provides additional peak dosage near the line end. Shot 625 uses a lower dosage than shot 624, if assigned shot dosages are allowed. If assigned shot dosages are not allowed, multi-pass exposure may be used with shot 625 being grouped into an exposure pass having a lower base dosage than the exposure pass with shot 624. The two shots 624 and 625 can produce a pattern 628 on the reticle, where the corners of pattern 628 are less rounded than the corners of pattern 618. The dashed line portions 629 of the perimeter of pattern 628 is shorter than the dashed line portion 619 of pattern 618, indicating improved line end edge slope in pattern 628, due to the higher line-end exposure in pattern 628 compared to pattern 618.

Figure 6D:
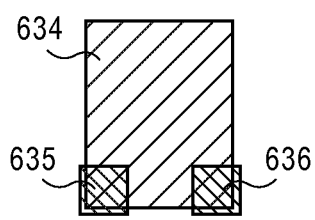
FIG. 6D illustrates an example of a method of forming the pattern of FIG. 6A on a surface by another embodiment of the current invention.

FIG. 6D illustrates another embodiment of the current invention, using three shots to form the line end 604 of pattern 602. Shot 634 uses higher-than-normal dosage, like shot 624 of FIG. 6C. Additionally, shots 635 and shot 636 overlap shot 634 and add additional peak dosage near the line end corners. Shots 635 and 636 may have lower dosage than shot 634. Shots 635 and 636 may, as illustrated in this example, extend beyond the outline of shot 634 and of the original pattern 602. Also, the illustrated shapes 635 and 636 may be shot as separate VSB shots, or in a single CP shot if a complex CP character is designed with the two illustrated shapes 635 and 636. The three VSB shots 634, 635 and 636, or two shots if a CP shot is used to shoot illustrated shapes 635 and 636, can produce a pattern 638 on a reticle, where pattern 638 corners are less rounded than the corners of pattern 628 which resulted from two shots. Additionally, low edge slope portion 639 of the perimeter of pattern 638 is smaller than perimeter portion 629 of pattern 628. FIG. 6D illustrates how larger numbers of shots may be used to form line end patterns which both more accurately achieve the desired shape and which have a higher edge slope.

Figure 6E:
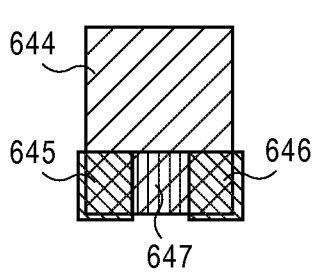
FIG. 6E illustrates an example of a method of forming the pattern of FIG. 6A on a surface by yet another embodiment of the current invention.

FIG. 6E illustrates yet another embodiment of the current invention, using four shots to form the line end 604 of pattern 602. In addition to main shot 644, which may have a higher-than-normal dosage, two corner shots 645 and 646 are used, and shot 647 adds exposure to the middle of the line-end. The dosage of shot 647 may be less than the dosage of shots 645 and 646. Shot 647 allows the dosage in the middle of the line end to be adjusted independently of the dosages for the line end corners. Pattern 648 illustrates a pattern that shots 644, 645, 646 and 647 can produce on a reticle. In pattern 648 the perimeter portion 649 which has a lower-than-minimum edge slope is slightly smaller than FIG. 6D perimeter portion 639. Additionally, the illustrated shapes 645 and 646 may be shot as a single complex CP character shot, if these shapes are designed and fabricated on a stencil.

FIGS. 6C-E illustrate how a set of shots may be modified with overlapping shots to produce small areas of high peak dosage near line ends, improving both the accuracy and the edge slope of the pattern manufactured on a reticle. Exposure of only a small area with a higher-than-normal dosage produces less increase in backscatter than if the higher-than-normal dosage was used for the entire pattern. The shots are modified with a shot varying technique, which may include varying one or all of: shot dosages, the placement of the overlap, and the size of the overlapping shot. Particle beam simulation may be used to determine the effect that a set of shots and dosages will produce on the reticle surface.

Figure 9A:
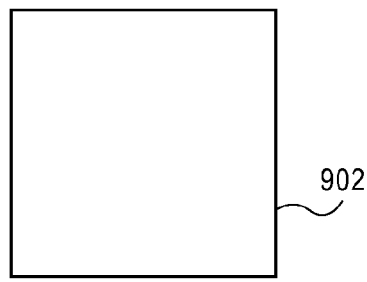
FIG. 9A illustrates a square pattern to be formed on a surface.
Figure 9B:
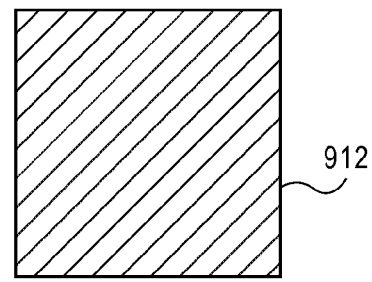
FIG. 9B illustrates a single-shot method of forming the pattern of FIG. 9A on a surface.
Figure 9C:
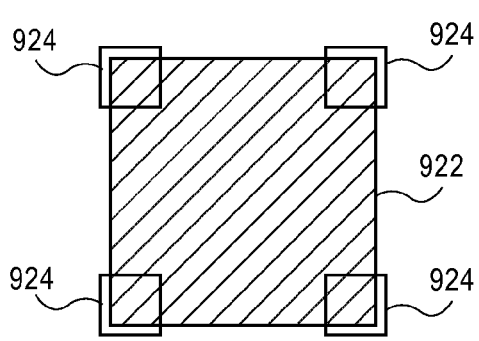
FIG. 9C illustrates an example of a method of forming the pattern of FIG. 9A on a surface by one embodiment of the current invention.

FIGS. 9A-E illustrate the use of overlapping shots with square patterns, such as are commonly used for contact and via patterns in integrated circuit design. FIG. 9A illustrates an example of a desired pattern 902 to be formed on a reticle. FIG. 9B illustrates a single VSB shot 912 which may be used to form pattern 902 conventionally. For small patterns, however, use of single VSB shot 912 may cause corner rounding similar to the corner rounding illustrated in FIG. 6B pattern 618. Also like pattern 618, use of single shot 912 may cause edge slope to be undesirably low. FIG. 9C illustrates an example of one embodiment of the present invention for forming a square or nearly-square pattern. Five VSB shots may be used, including shot 922, which is cross-hatched for identification, and four VSB corner shots 924 which overlap the corners of shot 922. Alternatively, all four illustrated corner shapes 924 may be designed into a single complex CP character on a stencil, allowing the example of FIG. 9C to be shot with one VSB shot 922 and one CP shot 924. As with the FIG. 6D line-end shot configuration, the addition of corner shots to increase peak dosage near the corners of the pattern may improve the fidelity of the transferred pattern, and may also improve the edge slope near the corners of the transferred pattern, so as to reduce CD variation.

Figure 9D:
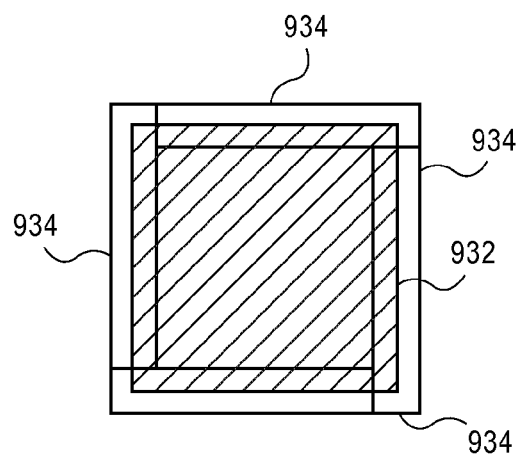
FIG. 9D illustrates an example of a method of forming the pattern of FIG. 9A on a surface by another embodiment of the current invention.

FIG. 9D illustrates an example of another embodiment of the present invention. Like the FIG. 9C shot configuration, FIG. 9D may be shot using five VSB shots, including shot 932, which is cross-hatched, and four additional shots 934 around the perimeter areas of the original pattern 902. Also like FIG. 9C, a CP character may be designed to expose the pattern illustrated by the four rectangles 934 in a single CP shot, allowing FIG. 9D to be exposed in one VSB shot 932 and one CP shot for all shapes 934. The use of the perimeter CP shot or VSB shots can increase the edge slope of the entire perimeter of the transferred pattern by increasing peak dosage near the perimeter. The small perimeter CP shot or VSB shots do not increase the area dosage as much as if a higher dosage was used for shot 912, reducing the backscatter compared to if a higher dosage shot 912 was used alone.

Figure 9E:
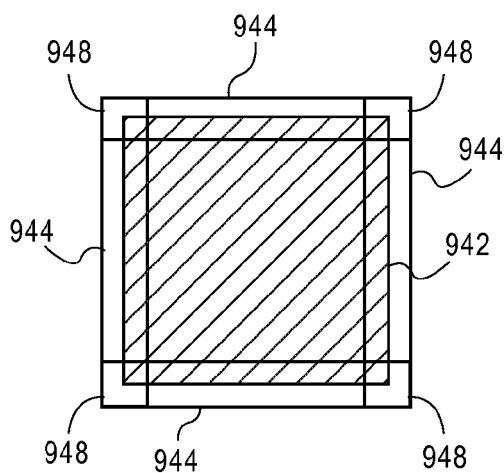
FIG. 9E illustrates an example of a method of forming the pattern of FIG. 9A on a surface by yet another embodiment of the current invention.

FIG. 9E illustrates an example of another embodiment of the present invention. Nine regions are illustrated in FIG. 9E: a) a large region 942, b) four side regions 944, and c) four corner regions 948. As can be seen, all regions 944 and 948 overlap region 942. These regions may be exposed by any of the following methods:

Nine separate VSB shots, including one for region 942, four shots for the four regions 944, and four shots for the four corner regions 948.

Five VSB shots. Region 942 is exposed by one shot. For the remaining four VSB shots, each shot includes the union of one side region 944 and two corner regions 948 adjacent to the side regions. This provides a higher dosage at the corners than along the side perimeters. The additional peak exposure near the corner may provide improved accuracy and/or edge slope.

One VSB shot for region 942 and two CP shots—one shot each of two CP characters. One CP character may be designed, for example to include the four side regions 944 and a second CP character may be designed to include the four corner regions 948. This solution allows independent dosage control of the corner regions and non-corner side regions.

The method using one VSB shot with two CP shots should require less exposure time than either the nine-shot VSB or the five-shot VSB methods. Additionally, the size of shot 942 may be modified to be smaller than the desired pattern 902.

The methods of this invention may also be employed with fabrication processes that use rectangular contacts and/or vias. For rectangular patterns with an aspect ratio of about 1:1.5 or less, the method illustrated in FIG. 9D may be used. For rectangular patterns with greater aspect ratios, each end of the longer axes of the rectangular pattern may be treated as a line end.

The solution described above with FIG. 9C may be implemented even using a charged particle beam system that does not allow dosage assignment for individual shots. In one embodiment of the present invention, a small number of dosages may be selected, for example two dosages such as 1.0× normal and 0.6× normal, and shots for each of these two dosages may be separated and exposed in two separate exposures passes, where the base dosage for one exposure pass is 1.0× normal and the base dosage for the other exposure pass is 0.6× normal. In the example of FIG. 9C, shot 922 may be assigned to a first exposure pass which uses a base dosage of 1.0× normal dosage before PEC correction. The four shots 924 may be assigned to a second exposure pass which uses a base dosage of 0.6× normal dosage before PEC correction. Thus, overlapping shots can create pattern dosages greater than 100% of normal, even with charged particle beam writers which do not support dosage assignment for individual shots.

The dosage that would be received by a surface can be calculated and stored as a two-dimensional (X and Y) dosage map called a glyph. A two-dimensional dosage map or glyph is a two-dimensional grid of calculated dosage values for the vicinity of the shots comprising the glyph. This dosage map or glyph can be stored in a library of glyphs. The glyph library can be used as input during fracturing of the patterns in a design. For example, referring again to FIG. 9D, a dosage map may be calculated for the combination of shots 932 and the four shots 934 and stored in the glyph library. If during fracturing, one of the input patterns is a square pattern of the same size as pattern 902, the glyph for pattern 902 and the five shots comprising the glyph may be retrieved from the library, avoiding the computational effort of determining an appropriate set of shots to form the square input pattern. Glyphs may also contain CP shots, and may contain dragged CP or VSB shots. A series of glyphs may also be combined to create a parameterized glyph. Parameters may be discrete or may be continuous. For example, the shots and dosage maps for forming square patterns such as square pattern 902 may be calculated for a plurality of pattern sizes, and the plurality of resulting glyphs may be combined to form a discrete parameterized glyph. In another example, a pattern width may be parameterized as a function of dragged shot velocity.

Figure 7:
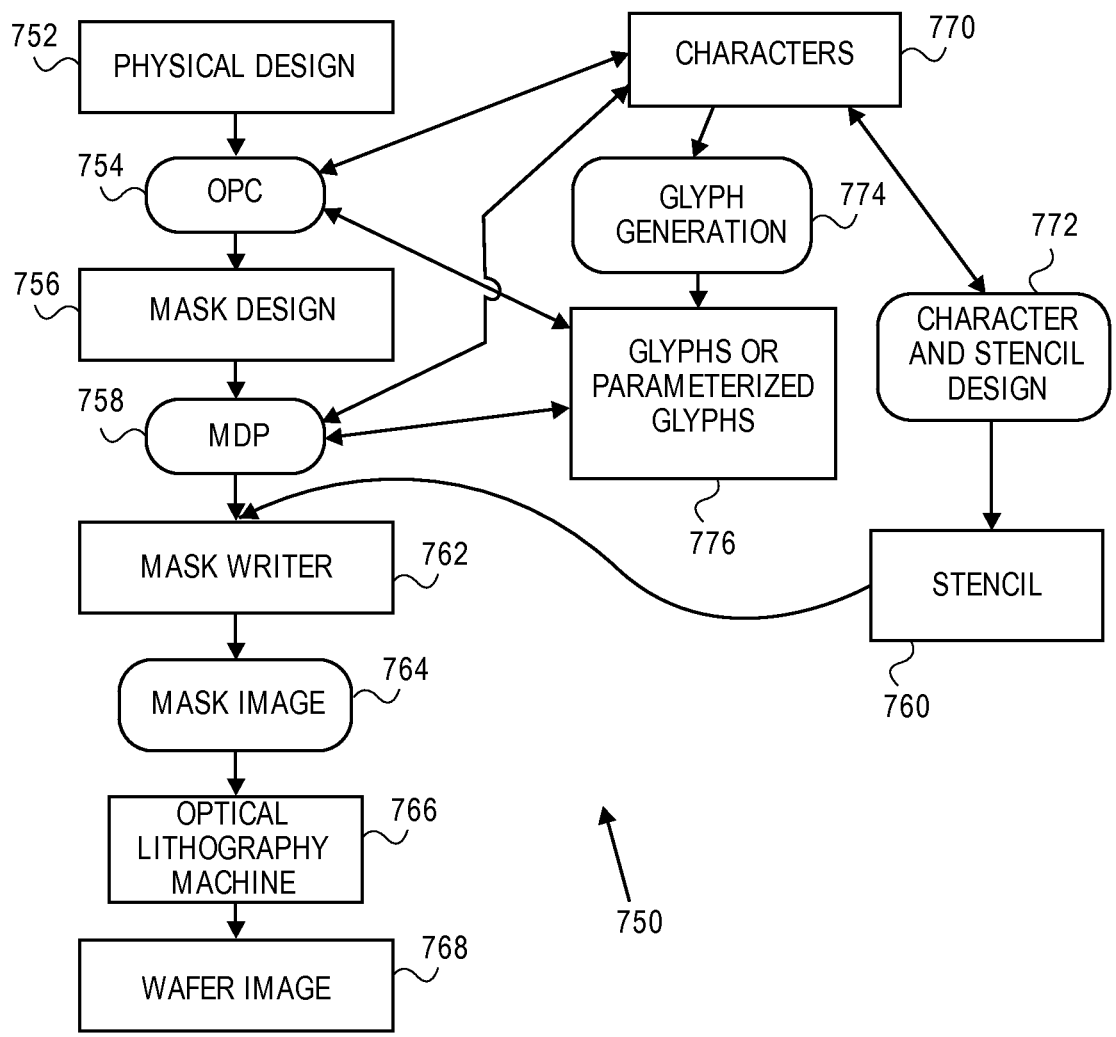
FIG. 7 illustrates a conceptual flow diagram of how to prepare a surface, such as a reticle, for use in fabricating a substrate such as an integrated circuit on a silicon wafer using optical lithography.

FIG. 7 is a conceptual flow diagram 750 of how to prepare a reticle for use in fabricating a surface such as an integrated circuit on a silicon wafer. In a first step 752, a physical design, such as a physical design of an integrated circuit, is designed. This can include determining the logic gates, transistors, metal layers, and other items that are required to be found in a physical design such as that in an integrated circuit. Next, in a step 754, optical proximity correction is determined. In an embodiment of this disclosure this can include taking as input a library of pre-calculated glyphs or parameterized glyphs 776. This can also alternatively, or in addition, include taking as input a library of pre-designed characters 770 including complex characters that are to be available on a stencil 760 in a step 762. In an embodiment of this disclosure, an OPC step 754 may also include simultaneous optimization of shot count or write times, and may also include a fracturing operation, a shot placement operation, a dose assignment operation, or may also include a shot sequence optimization operation, or other mask data preparation operations, with some or all of these operations being simultaneous or combined in a single step. Once optical proximity correction is completed a mask design is developed in a step 756.

In a step 758, a mask data preparation operation which may include a fracturing operation, a shot placement operation, a dose assignment operation, or a shot sequence optimization may take place. Either of the steps of the OPC step 754 or of the MDP step 758, or a separate program independent of these two steps 754 or 758 can include a program for determining a limited number of stencil characters that need to be present on a stencil or a large number of glyphs or parameterized glyphs that can be shot on the surface with a small number of shots by combining characters that need to be present on a stencil with varying dose, position, and degree of partial exposure to write all or a large part of the required patterns on a reticle. Combining OPC and any or all of the various operations of mask data preparation in one step is contemplated in this disclosure. Mask data preparation step 758, which may include a fracturing operation, may also comprise a pattern matching operation to match glyphs to create a mask that matches closely to the mask design. In some embodiments of this disclosure, mask data preparation step 758 may include generating overlapping shots so as to produce a higher peak dosage near line ends or near perimeters of square or nearly-square patterns. Mask data preparation may also comprise inputting patterns to be formed on a surface with the patterns being slightly different, selecting a set of characters to be used to form the number of patterns, the set of characters fitting on a stencil mask, the set of characters possibly including both complex and VSB characters, and the set of characters based on varying character dose or varying character position or applying partial exposure of a character within the set of characters or dragging a character to reduce the shot count or total write time. A set of slightly different patterns on the surface may be designed to produce substantially the same pattern on a substrate. Also, the set of characters may be selected from a predetermined set of characters. In one embodiment of this disclosure, a set of characters available on a stencil in a step 770 that may be selected quickly during the mask writing step 762 may be prepared for a specific mask design. In that embodiment, once the mask data preparation step 758 is completed, a stencil is prepared in a step 760. In another embodiment of this disclosure, a stencil is prepared in the step 760 prior to or simultaneous with the MDP step 758 and may be independent of the particular mask design. In this embodiment, the characters available in the step 770 and the stencil layout are designed in step 772 to output generically for many potential mask designs 756 to incorporate slightly different patterns that are likely to be output by a particular OPC program 754 or a particular MDP program 758 or particular types of designs that characterizes the physical design 752 such as memories, flash memories, system on chip designs, or particular process technology being designed to in physical design 752, or a particular cell library used in physical design 752, or any other common characteristics that may form different sets of slightly different patterns in mask design 756. The stencil can include a set of characters, such as a limited number of characters that was determined in the step 758, including a set of adjustment characters.

Once the stencil is completed the stencil is used to generate a surface in a mask writer machine, such as an electron beam writer system. This particular step is identified as a step 762. The electron beam writer system projects a beam of electrons through the stencil onto a surface to form patterns in a surface, as shown in a step 764. The completed surface may then be used in an optical lithography machine, which is shown in a step 766. Finally, in a step 768, a substrate such as a silicon wafer is produced. As has been previously described, in step 770 characters may be provided to the OPC step 754 or the MDP step 758. The step 770 also provides characters to a character and stencil design step 772 or a glyph generation step 774. The character and stencil design step 772 provides input to the stencil step 760 and to the characters step 770. The glyph generation step 774 provides information to a glyphs or parameterized glyphs step 776. Also, as has been discussed, the glyphs or parameterized glyphs step 776 provides information to the OPC step 754 or the MDP step 758.

Figure 8:
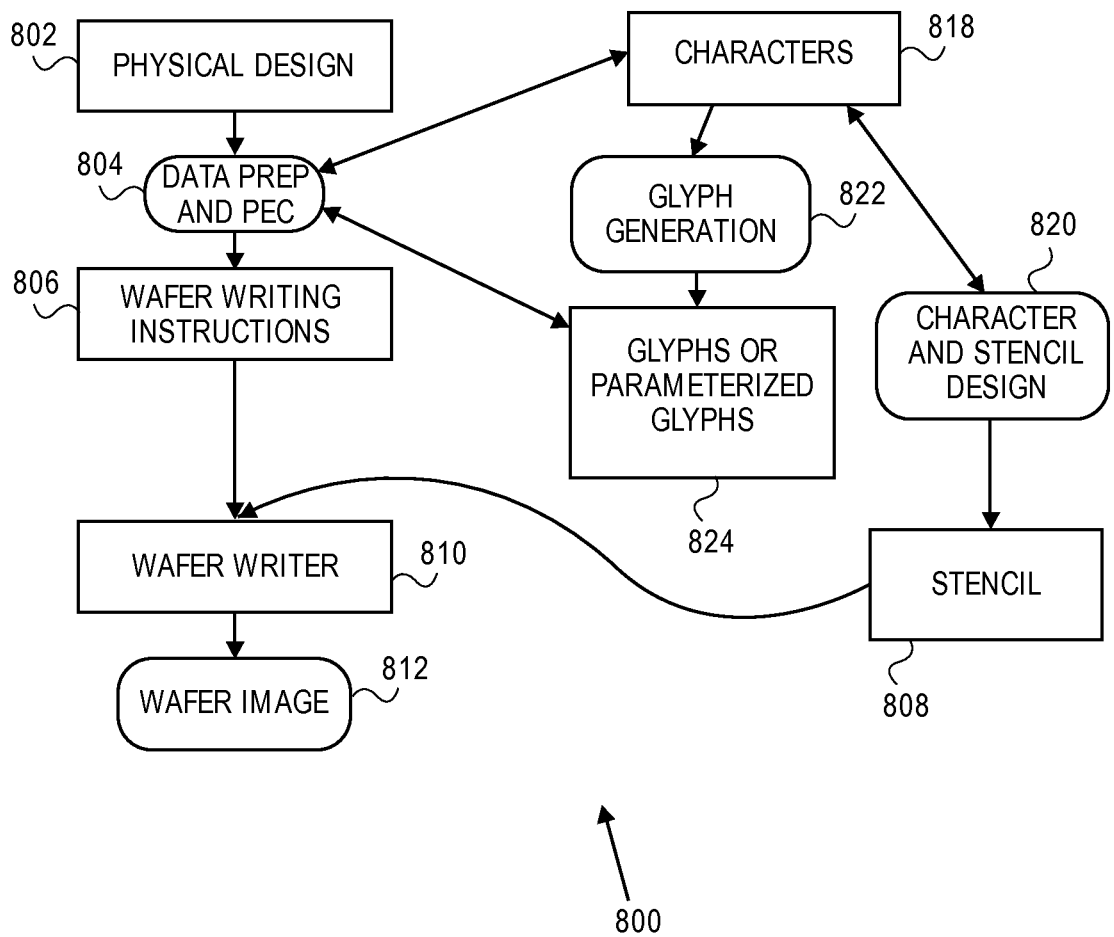
FIG. 8 illustrates a conceptual flow diagram of how to prepare a surface for use in fabricating a substrate such as an integrated circuit on a silicon wafer.

Referring now to FIG. 8, another exemplary conceptual flow diagram 800 of how to prepare a surface which is directly written on a substrate such as a silicon wafer is shown. In a first step 802, a physical design, such as a physical design of an integrated circuit is designed. This may be an ideal pattern that the designer wants transferred onto a substrate. Next, in a step 804, various data preparation (DP) steps, including fracturing and PEC, are performed to prepare input data to a substrate writing device. Step 804 may include fracturing of the patterns into a set of complex CP and/or VSB shots, where some of the shots may overlap each other. The step 804 may also comprise inputting possible glyphs or parameterized glyphs from step 824, the glyphs being based on predetermined characters from step 818, and the glyphs being determined using a calculation of varying a character dose or varying a character position or applying partial exposure of a character in glyph generation step 822. The step 804 may also comprise pattern matching to match glyphs to create a wafer image that matches closely to the physical design created in the step 802. Iterations, potentially including only one iteration where a correct-by-construction "deterministic" calculation is performed, of pattern matching, dose assignment, and equivalence checking may also be performed. In some embodiments of this disclosure, data preparation step 804 may include generating overlapping shots near the line ends or near the perimeters of square or nearly-square patterns. A stencil is prepared in a step 808 and is then provided to a wafer writer in a step 810. Once the stencil is completed the stencil is used to prepare a wafer in a wafer writer machine, such as an electron beam writer system. This step is identified as the step 810. The electron beam writer system projects a beam of electrons through the stencil onto a surface to form patterns in a surface. The surface is completed in a step 812.

Further, in a step 818 characters may be provided to the data preparation and PEC step 804. The step 818 also provides characters to a glyph generation step 822. The character and stencil design step 820 provides input to the stencil step 808 or to a character step 818. The character step 818 may provide input to the character and stencil design step 820. The glyph generation step 822 provides information to a glyphs or parameterized glyphs step 824. The glyphs or parameterized glyphs step 824 provides information to the Data Prep and PEC step 804. The step 810 may include repeated application as required for each layer of processing, potentially with some processed using the methods described in association with FIG. 7, and others processed using the methods outlined above with respect to FIG. 8, or others produced using any other wafer writing method to produce integrated circuits on the silicon wafer.

The fracturing, mask data preparation, proximity effect correction and glyph creation flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, and proximity effect correction may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for fracturing or mask data preparation or proximity effect correction comprising the steps of:
    calculating a line end pattern that will be produced on a resist-coated surface and calculating the edge slope of the line end pattern from an original set of shots for a shaped beam charged particle beam writer;
    modifying the original set of shots to improve the edge slope of the calculated line end pattern by increasing a dosage delivered to the surface near the line end, such that the surface dosage near the line end is higher than a normal dosage, wherein the modification comprises at least one of the group consisting of 1) determining an additional shot which overlaps a shot in the set of shots; 2) varying the overlap of two or more shots in the set of shots; 3) varying the size of a shot which overlaps another shot; and 4) varying the dosage of a shot in the set of shots with respect to the dosage of another overlapping shot in the set of shots, wherein the resist comprises a resist threshold, and wherein the edge slope comprises the slope of the surface dosage, at the resist threshold, with respect to a linear dimension perpendicular to the perimeter of the pattern; and
    inputting a library of precalculated glyphs, wherein the step of determining determines shots from one or more glyphs, and wherein the glyph precalculation constitutes at least a part of the pattern calculation.

2. The method of claim 1 wherein the step of calculating comprises charged particle beam simulation.

3. The method of claim 2 wherein the charged particle beam simulation includes at least one of a group consisting of forward scattering, backward scattering, resist diffusion, Coulomb effect, etching, fogging, loading and resist charging.

4. The method of claim 1 wherein the modified set of shots includes a character projection shot of a complex character.

5. The method of claim 1 wherein the modified set of shots increases the peak dosage near the line end.

6. A method for fracturing or mask data preparation or proximity effect correction comprising the step of:
    determining a plurality of shots for a shaped beam charged particle beam writer, wherein the plurality of shots forms a line end pattern on a resist-coated surface, wherein the step of determining comprises calculating the pattern on the surface and calculating the edge slope of the pattern from the plurality of shots, and wherein the edge slope of the line end pattern on the surface is improved using a shot varying technique comprising at least one of the group consisting of 1) varying the dosage of a shot overlapping another shot; 2) varying the overlap of two or more shots; and 3) varying the size of a shot which overlaps another shot,
    wherein the resist comprises a threshold, wherein the edge slope comprises the slope of a calculated dosage on the surface, at the resist threshold, with respect to a linear dimension perpendicular to the perimeter of the pattern on the surface, and wherein the shot varying technique produces a pattern dosage which is higher than a normal dosage near the line end; and
    inputting a library of precalculated glyphs, wherein the step of determining determines shots from one or more glyphs, and wherein the glyph precalculation constitutes at least a part of the pattern calculation.

7. The method of claim 6 wherein the step of determining comprises determining shots for multiple exposure passes, and wherein overlapping shots are placed in different exposure passes.

8. The method of claim 6 wherein a complex character shot is determined.

9. The method of claim 6 wherein an optimization technique is used to determine the plurality of shots.

10. The method of claim 6 wherein the calculating comprises charged particle beam simulation.

11. A method for fracturing or mask data preparation or proximity effect correction comprising the step of:
    determining a plurality of shots for a shaped beam charged particle beam writer, wherein the plurality of shots forms a square or nearly-square pattern on a resist-coated surface, wherein the step of determining comprises calculating the pattern on the surface and calculating the edge slope of the pattern from the plurality of shots, and wherein the edge slope of the square pattern on the surface is improved using a shot varying technique comprising at least one of the group consisting of 1) varying the dosage of a shot overlapping another shot; 2) varying the overlap of two or more shots; and 3) varying the size of a shot which overlaps another shot,
    wherein the resist comprises a resist threshold, wherein the edge slope comprises the slope of a calculated dosage on the surface, at the resist threshold, with respect to a linear dimension perpendicular to the perimeter of the pattern on the surface, and wherein the shot varying technique produces a pattern dosage which is higher than a normal dosage near the perimeter of the pattern; and inputting a library of precalculated glyphs, wherein the step of determining determines shots from one or more glyphs, and wherein the glyph precalculation constitutes at least a part of the pattern calculation.

12. The method of claim 11 wherein the step of calculating comprises charged particle beam simulation.

13. The method of claim 11 wherein the plurality of shots produces a higher peak dosage near the corners of the pattern than in the center of the pattern.

14. A method for manufacturing a resist-coated surface comprising the steps of:

determining a plurality of shots for a shaped beam charged particle beam writer, wherein the plurality of shots will form a line end pattern on a surface, wherein the step of determining comprises calculating the pattern on the surface and calculating the edge slope of the pattern from the plurality of shots, and wherein the edge slope of the line end pattern on the surface is improved using a shot varying technique comprising at least one of the group consisting of 1) varying the dosage of a shot overlapping another shot; 2) varying the overlap of two or more shots; and 3) varying the size of a shot which overlaps another shot, wherein the shot varying technique produces a pattern dosage which is higher than a normal dosage near the line end, wherein the resist comprises a resist threshold, and wherein the edge slope comprises the slope of a calculated dosage on the surface, at the resist threshold, with respect to a linear dimension perpendicular to the perimeter of the pattern on the surface inputting a library of precalculated glyphs, wherein the step of determining determines shots from one or more glyphs, and wherein the glyph precalculation constitutes at least a part of the pattern calculation; and forming the line end pattern on the surface using the plurality of charged particle beam shots.

15. The method of claim 14 wherein the step of determining comprises determining shots for multiple exposure passes, and wherein overlapping shots are placed in different exposure passes.

16. The method of claim 14 wherein the set of shots includes a complex character.

17. The method of claim 14 wherein the calculating comprises charged particle beam simulation.

18. A method for manufacturing a resist-coated surface comprising the steps of:

determining a plurality of shots for a shaped beam charged particle beam writer, wherein the plurality of shots form a square or nearly-square pattern on the surface, wherein the step of determining comprises calculating the pattern on the surface and calculating the edge slope of the pattern from the plurality of shots, and wherein the edge slope of the pattern on the surface is improved using a shot varying technique comprising at least one of the group consisting of 1) varying the dosage of a shot overlapping another shot; 2) varying the overlap of two or more shots; and 3) varying the size of a shot which overlaps another shot, wherein the shot varying technique produces a pattern dosage which is higher than a normal dosage near the perimeter of the pattern, wherein the resist comprises a resist threshold, and wherein the edge slope comprises the slope of a calculated dosage on the surface, at the resist threshold, with respect to a linear dimension perpendicular to the perimeter of the pattern on the surface inputting a library of precalculated glyphs, wherein the step of determining determines shots from one or more glyphs, and wherein the glyph precalculation constitutes at least a part of the pattern calculation; and forming the square or nearly-square pattern on the surface using the charged particle beam writer and the plurality of shots.

19. A system for fracturing or mask data preparation or proximity effect correction comprising:

a device capable of determining a plurality of charged particle beam shots which can form a line end pattern on a resist-coated surface, wherein the device capable of determining comprises a device capable of calculating the pattern on the surface and calculating the edge slope of the pattern from the plurality of shots, and wherein the edge slope of the line end pattern on the surface is improved using a shot varying technique comprising at least one of the group consisting of 1) varying the dosage of a shot overlapping another shot; 2) varying the overlap of two or more shots; and 3) varying the size of a shot which overlaps another shot, wherein the shot varying technique produces a pattern dosage which is higher than a normal dosage near the line end, wherein the resist comprises a resist threshold, and wherein the edge slope comprises the slope of a calculated dosage on the surface, at the resist threshold, with respect to a linear dimension perpendicular to the perimeter of the pattern on the surface; and a device capable of inputting a library of precalculated glyphs, wherein the step of determining determines shots from one or more glyphs, and wherein the glyph precalculation constitutes at least a part of the pattern calculation.

20. The system of claim 19 wherein the device capable of calculating performs charged particle beam simulation.

21. The system of claim 20 wherein the charged particle beam simulation includes at least one of a group consisting of forward scattering, backward scattering, resist diffusion, Coulomb effect, etching, fogging, loading and resist charging.

22. The system of claim 19 wherein the device capable of determining uses an optimization technique.

23. A system for fracturing or mask data preparation or proximity effect correction comprising:

a device capable of determining a plurality of charged particle beam shots which can form a square or nearly-square pattern on a surface, wherein the device capable of determining comprises a device capable of calculating the pattern on the surface and calculating the edge slope of the pattern from the plurality of shots, and wherein the edge slope of the square pattern on the surface is improved using a shot varying technique comprising at least one of the group consisting of 1) varying the dosage of a shot overlapping another shot; 2) varying the overlap of two or more shots; and 3) varying the size of a shot which overlaps another shot, wherein the shot varying technique produces a pattern dosage which is higher than a normal dosage near the perimeter of the pattern, wherein the resist comprises a resist threshold, and wherein the edge slope comprises the slope of a calculated dosage on the surface, at the resist threshold, with respect to a linear dimension perpendicular to the perimeter of the pattern on the surface; and a device capable of inputting a library of precalculated glyphs, wherein the step of determining determines shots from one or more glyphs, and wherein the glyph precalculation constitutes at least a part of the pattern calculation.

24. The system of claim 23 wherein the device capable of calculating performs charged particle beam simulation.

* * * * *